(12) United States Patent
Paris et al.

(10) Patent No.: US 10,550,928 B2
(45) Date of Patent: Feb. 4, 2020

(54) THERMAL MANAGEMENT OF A SYSTEM FOR TRANSMISSION ACTIVE WARM UP AND INTERNAL ELECTRONICS COOLING

(71) Applicant: Continental Automotive Systems, Inc., Auburn Hills, MI (US)

(72) Inventors: James J Paris, River Forest, IL (US); James D Baer, Gurnee, IL (US); Dan Finch, Cary, IL (US)

(73) Assignee: Vitesco Technologies USA, LLC, Auburn Hills, MI (US)

(*) Notice: Subject to any disclaimer, the term of this patent is extended or adjusted under 35 U.S.C. 154(b) by 0 days.

(21) Appl. No.: 15/581,967

(22) Filed: Apr. 28, 2017

(65) Prior Publication Data

US 2017/0314669 A1 Nov. 2, 2017

Related U.S. Application Data

(60) Provisional application No. 62/328,671, filed on Apr. 28, 2016.

(51) Int. Cl.
*F16H 57/04* (2010.01)
*F16H 61/00* (2006.01)
(Continued)

(52) U.S. Cl.
CPC ..... *F16H 57/0417* (2013.01); *F16H 57/0413* (2013.01); *F16H 61/0006* (2013.01);
(Continued)

(58) Field of Classification Search
CPC ............ B60H 1/00385; B60H 1/00835; B60H 1/00885; B60H 1/00899; B60H 2001/00928; H01M 10/613; H01M 10/625; H01M 10/663; H01M 2220/20; F16H 57/0417; F16H 57/0413; F16H 57/412;
(Continued)

(56) References Cited

U.S. PATENT DOCUMENTS 6,530,856 B1 * 3/2003 Kakiage .............. F16H 61/0006
475/123
2002/0166409 A1 11/2002 True et al.
(Continued)

OTHER PUBLICATIONS

The International Search Report and the Written Opinion of the International Searching Authority for corresponding PCT application No. PCT/US2017/030170 dated Sep. 21, 2017.

*Primary Examiner* — Dion Ferguson
*Assistant Examiner* — Amir A Jalali

(57) ABSTRACT

A thermal management system includes a transmission, a heat exchanger, and a transmission control unit. The transmission includes: a transmission housing; a transmission pan housed within the transmission housing; transmission fluid contained within the transmission pan; and a transmission fluid conduit configured to circulate the transmission fluid between the transmission pan and within the transmission housing. The heat exchanger is disposed within the transmission housing and has a first surface positioned on the transmission pan and a second surface. The transmission control unit is disposed on and supported by the second surface of the heat exchanger such that the heat exchanger controls the temperature of the transmission control unit.

10 Claims, 3 Drawing Sheets

(51) Int. Cl.
*F28F 27/02* (2006.01)
*H05K 7/20* (2006.01)

(52) U.S. Cl.
CPC ......... *F28F 27/02* (2013.01); *H05K 7/20263* (2013.01); *H05K 7/20272* (2013.01); *H05K 7/20281* (2013.01); *F28F 2250/06* (2013.01)

(58) Field of Classification Search
CPC ............ F16H 61/0006; H05K 7/20263; H05K 7/20272; H05K 7/20281; F28F 27/02; F28F 2250/06
USPC .......................................................... 361/701
See application file for complete search history.

(56) References Cited

U.S. PATENT DOCUMENTS

| | | | |
|---|---|---|---|
| 2009/0101312 A1* | 4/2009 | Gooden | F16H 57/0413 165/104.19 |
| 2009/0320642 A1* | 12/2009 | Fuhrer | F28D 7/1638 74/606 A |
| 2011/0228478 A1* | 9/2011 | Takata | F16H 61/0006 361/699 |
| 2013/0247864 A1* | 9/2013 | Samie | F01N 5/02 123/196 AB |
| 2015/0354692 A1* | 12/2015 | Gooden | F16H 57/0417 165/51 |
| 2016/0021796 A1 | 1/2016 | Vogerl et al. | |
| 2016/0033175 A1* | 2/2016 | Ragazzi | F25B 13/00 62/115 |
| 2016/0186649 A1* | 6/2016 | Rollinger | G01F 23/2962 123/41.15 |
| 2016/0273435 A1* | 9/2016 | Hussain | F01N 5/02 |
| 2017/0037770 A1* | 2/2017 | Cook | F01P 7/165 |
| 2017/0051821 A1* | 2/2017 | Long | F16H 57/0412 |
| 2017/0211685 A1* | 7/2017 | Hutchins | F16H 57/0417 |

* cited by examiner

THERMAL MANAGEMENT OF A SYSTEM FOR TRANSMISSION ACTIVE WARM UP AND INTERNAL ELECTRONICS COOLING

CROSS REFERENCE TO RELATED APPLICATIONS

This U.S. patent application claims priority under 35 U.S.C. § 119(e) to U.S. Provisional Application 62/328,671, filed Apr. 28, 2016, which is hereby incorporated by reference in its entirety.

TECHNICAL FIELD

The disclosure relates to a transmission having a transmission control unit (TCU) connected to a heat exchanger, where the transmission control unit and heat exchanger are both located inside or on the transmission.

BACKGROUND

A transmission is a machine that provides controlled application of a vehicle engine power. In other words, the vehicle transmission adapts an output of an internal combustion engine to the driven wheels by reducing a high engine speed to a slower speed, which allows the vehicle to start, stop, and move at a slower speed.

FIG. 1 illustrates a schematic view of a cooling system 100 for a vehicle used for controlling the temperature of an automatic transmission 120. The system 100 includes a radiator 104 and an engine 106. The radiator 104 is in fluid communication with the engine 106 and is used to control the engine's temperature and cool cooling fluid circulating between the radiator 104 and the engine 106. The system 100 includes a thermostat 108 in fluid communication between the radiator 104 and the engine 106. The thermostat 108 is configured to maintain a temperature of the engine 106 near its optimum operating temperature by regulating the flow of cooling fluid to the engine 106.

The system 100 also includes a heater core 110 that is also in fluid communication with the engine 106. The heater core 110 is a radiator-like device used to heat an interior of the vehicle. Hot coolant from the engine 106 is passed through a winding tube of the heater core 110 before returning to the engine 106, causing a heat exchange between the hot coolant and the air in the interior of the vehicle.

The system 100 also includes an oil cooler 112 used to provide additional cooling to the engine oil before it flows back to the engine 106. The hot engine 106 transfers heat to the oil cooler 112 by way of the heater core 110 which cools the engine oil and transfers it back to the engine 106.

In some examples, the system 10 also includes a heat exchanger 114, such as but not limited to, an ATWU heat exchanger. The heat exchanger 114 is designed to allow heat transfer between two fluids, one being the fluid received from the heater core 110 and transferred to the oil cooler 112.

The system 100 also includes a first bypass valve 116, such as, but not limited to, an automatic transmission warm-up unit (ATWU) bypass valve. The ATWU bypass valve 116 is in fluid communication with the heater core 110, a heat exchanger 114, the oil cooler 112, and the engine 106. The heater core 110 is in fluid communication with the heat exchanger 114 which receives engine oil from the heater core 110 and transmits the fluid to the oil cooler 112; however, in some examples, the ATWU bypass valve 116 bypasses the heat exchanger 114 and the oil cooler 112 and transmits the engine oil to the engine 106.

The system 100 may also include an electronic control unit (ECU) 118 that controls one or more electrical systems or subsystems of the vehicle. The ECU 118 receives temperature sensor data from one or more temperature sensors outside air, engine coolant, and transmission oil. The ECU 118 controls a series of actuator on the internal combustion engine to ensure that the engine 106 works at its optimal performance. In addition, the ECU 118 provides electrical ground bypass for the first bypass valve 116.

As shown, the heat exchanger 114 is designed to allow heat transfer between fluids from the engine 106 (i.e., engine oil) and the automatic transmission 120 (i.e., transmission fluid). In some examples, the system 100 includes an auxiliary cooler 122 for providing additional cooling to the automatic transmission 120 when needed. An auxiliary cooler bypass valve 124 allows the transmission fluid to bypass the auxiliary cooler 122 when no additional cooling is needed.

The system 100 also includes a transmission control unit (TCU) 126 in communication with the automatic transmission 120 and the ECU 118. The TCU 126 is commonly used for controlling the operation of an automatic transmission of a vehicle. As such, the TCU 126 receives sensor data from the sensors and ECU data from the ECU 118, and based on the received data, the TCU 126 determines how and when to change gears in the vehicle for optimum performance and fuel economy. Generally, the TCU 126 is places outside the transmission 120 to prevent the TCU 126 from being exposed to the high heat of the transmission 120, which may reach 140 degrees Celsius. The TCU includes circuitry, which may malfunction when exposed to the high temperatures of the transmission 120. This limitation has generally lead to transmissions being designed such that the TCU 126 is located outside the automatic transmission, as shown. This presents limitations with regard to packaging, and where to place the TCU within the engine compartment.

SUMMARY

One aspect of the disclosure provides a transmission that includes a transmission control unit located inside the transmission, and a heat exchanger also located inside the transmission. The heat exchanger, located inside the transmission, controls the temperature of the transmission fluid, such that the transmission control unit is able to function properly while submerged in the transmission fluid. The transmission control unit is connected to the outside surface the heat exchanger, where the outside surface of the heat exchanger is at a controlled temperature. The transmission control unit is exposed to the controlled temperature of the outer surface of the heat exchanger, which controls the temperature of the transmission control unit. The transmission also includes a transmission pan, and the heat exchanger is located in the transmission pan. The heat exchanger also controls the temperature of transmission fluid located around the heat exchanger.

Another aspect of the disclosure provides a transmission that includes a transmission control unit located inside the transmission, and a heat exchanger located on the transmission case. The heat exchanger, controls the temperature of the transmission metal case wall, such that the transmission control unit is able to function properly while submerged in the transmission fluid. The transmission control unit is connected to the transmission wall that is connected, in turn, to the outside surface the heat exchanger, where the outside surface of the heat exchanger is at a controlled temperature. The transmission control unit is exposed to the controlled temperature of the outer surface of the heat exchanger, which controls the temperature of the transmission control unit.

Another aspect of the disclosure provides a thermal management system that includes a transmission having a transmission housing. The thermal management system also includes a heat exchanger disposed within the transmission housing. The thermal management system also includes a transmission control unit disposed on and supported by the heat exchanger such that the heat exchanger controls a temperature of the transmission control unit.

Implementations of this aspect of the disclosure may include one or more of the following optional features. In some implementations, the thermal management system also includes a transmission pan positioned within the transmission housing. The transmission pan supports the heat exchanger. The heat exchanger controls a temperature of transmission fluid located around the heat exchanger. In some examples, the thermal management system includes transmission fluid, where the transmission fluid is circulated inside the transmission.

In some implementations, the thermal management system further includes an auxiliary cooler and a bypass valve in fluid communication with a transmission conduit and the auxiliary cooler. The bypass valve is located inside the transmission, the bypass valve configured to determine when the transmission fluid needs more cooling and therefore routes the transmission fluid to the auxiliary cooler.

Another aspect of the disclosure provides a thermal management system include a transmission, a heat exchanger, and a transmission control unit. The transmission includes transmission housing, a transmission pan housed within the transmission housing, transmission fluid supported by the transmission pan; and a transmission fluid conduit configured to circulate the transmission fluid from the transmission pan to within the transmission housing. The heat exchanger is disposed within the transmission housing and has a first surface positioned on the transmission pan and a second surface. The transmission control unit is disposed on and supported by the second surface of the heat exchanger such that the heat exchanger controls a temperature of the transmission control unit.

Implementations of this aspect of the disclosure may include one or more of the following optional features. In some implementations, the transmission fluid conduit includes a first fluid conduit and a second fluid conduit. The first fluid conduit and the second fluid conduit are in fluid communication with each other, and partially disposed within the heat exchanger.

In some examples, the thermal management system further includes an engine fluid conduit having a first fluid conduit and a second fluid conduit. The first fluid conduit and the second fluid conduit are in fluid communication with each other, and partially disposed within the heat exchanger. In some implementations, the engine fluid conduit and the transmission fluid conduit exchange heat altering a temperature associated with each one of the engine fluid conduit and the transmission fluid conduit.

In some implementations, the transmission control unit includes: a base plate supported by the heat exchanger; a printed circuit board supported by the base plate; and a cover configured to cover the printed circuit board. In some examples, the transmission control unit is submerged in the transmission fluid located in the transmission pan. The transmission control unit may further include a lead frame disposed between the base plate and the cover. The lead frame may extend through a portion of the transmission pan. The second surface of the heat exchanger has a controlled temperature.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

In some implementations, it is desirable to have a thermal management system that includes a transmission that incorporates design features allowing a transmission control unit (TCU) to be placed inside the transmission, without requiring the use of expensive material for the TCU to overcome the high transmission heat. It is also desirable to provide proper cooling to the TCU within the transmission.

Figure 2:
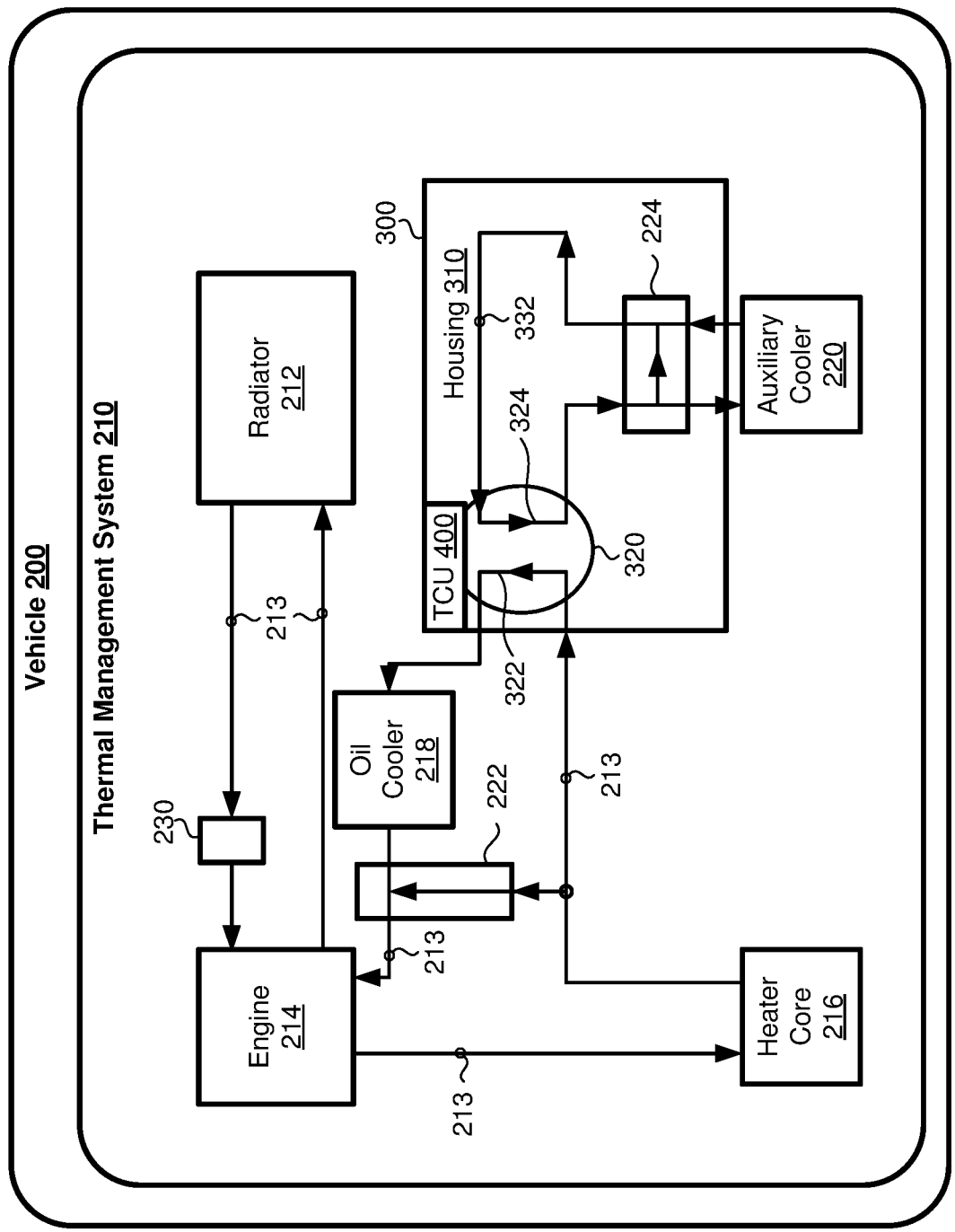
FIG. 2 a schematic view of a thermal management system for a vehicle having a transmission with a transmission control unit and a heat exchanger located inside the transmission.

Referring to FIG. 2, in some implementations, a vehicle 200 includes a thermal management system 210 for efficiently managing the heating and/or cooling of different modules and systems within the vehicle 200. The system 210 includes a radiator 212, an engine 214, an oil cooler 218, and sometimes an auxiliary cooler 220. Additionally, the system 210 may include first and second bypass valves 222, 224. The system 210 also includes an automatic transmission 300 that includes a transmission housing 310 configured to house a heat exchanger 320 and a TCU or mechatronic unit 400. Positioning the heat exchanger 320 within the housing 310 of the transmission allows the heat exchanger 320 to act both as a mounting plate for supporting the TCU 400 and a cooling device for the TCU 400. As such, the system 210 may use cheaper material when designing the TCU 400 due to the position and cooling/heating effects of the heat exchanger 320 on the TCU 400.

As shown, the engine 214 is in fluid communication with the radiator 212. A thermostat 230 is positioned between the engine 214 and the radiator 212 and is in fluid communication with both the engine 214 and the radiator 212. When the engine 214 is cold, the thermostat 230 is operated at a phase-shut state, i.e., preventing fluid flow from the radiator 212 to the engine 214. When the fluid in the radiator 212 reaches a specific temperature, then the thermostat 230 opens at a phase-open state allowing fluid to flow from the radiator 212 to the engine 214, which provides cooling fluid to the engine 214. During a warm up state of the engine 214, which is while the thermostat 230 is in the phase-shut state that prevents cooling fluid to flow from the radiator 212, the heat that the engine 214 produces may be used to heat other systems in the vehicle 200.

In some examples, the engine 214 is in fluid communication with the heater core 216 and provides engine fluid to the heater core 216. The heater core 216 receives warm fluid 213 from the engine 214 and heats an interior of the vehicle 200. Once the fluid 213 passes through the heater core 216, the engine fluid 213 may either bypass the transmission 300 that is in fluid communication with the heater core 216 by way of a bypass valve 222 in fluid communication with the heater core 216, the oil cooler 218, and the engine 214. In cases where the engine fluid 213 goes through the transmission 300, in some examples, an oil-water heat exchange occurs between the engine fluid 213 (e.g., oil) and transmission fluid (water) 332 that is circulating within the transmission 300. In some examples, the transmission 300 may exceed the thermal capacity of the transmission coolant 332 to cool the engine fluid 215; in this case, the system 210 includes an auxiliary cooler 220 to further cool the transmission fluid 332 causing the engine fluid 213 to further cool. When the transmission fluid 332 does not need further cooling, the second bypass valve 222 bypasses the auxiliary cooler 220. However, when the transmission fluid 332 needs further cooling, the second bypass valve 222 allows the transmission fluid 332 to flow to the auxiliary cooler 220 which further cools the transmission fluid 332.

As shown, the transmission 300 includes a transmission housing 310 that houses the heat exchanger 320. In addition, the TCU 400 is supported by and/or attached to the heat exchanger 320. In some examples, the heat exchanger 320 controls the temperature of the transmission housing 310, for example, a transmission metal housing wall, such that the TCU 40 is able to function properly while submerged in the transmission fluid 332.

The heat exchanger 320 may include a first piping 322 for transmitting engine fluid 213 from the heater core 216 to the oil cooler 218 and a second piping 324 for transmitting transmission fluid 332 within the transmission 300 allowing heat exchange between the two fluids 213, 332. However, in other examples, the heat exchanger 320 may include a water to air or a water to oil bath, for example a heat exchanger submerged in oil or engine fluid (See FIG. 3). In this case, the TCU 400 sits on the cold plate specifically where heat is needed to be removed. Therefore, the heat exchanger 320 provides an actively cooled mount configured to receive the TCM 400, which allows the use of less expensive TCM 400 due to the lower temperature that the TCM 400 has to withstand within the transmission 300.

Figure 3:
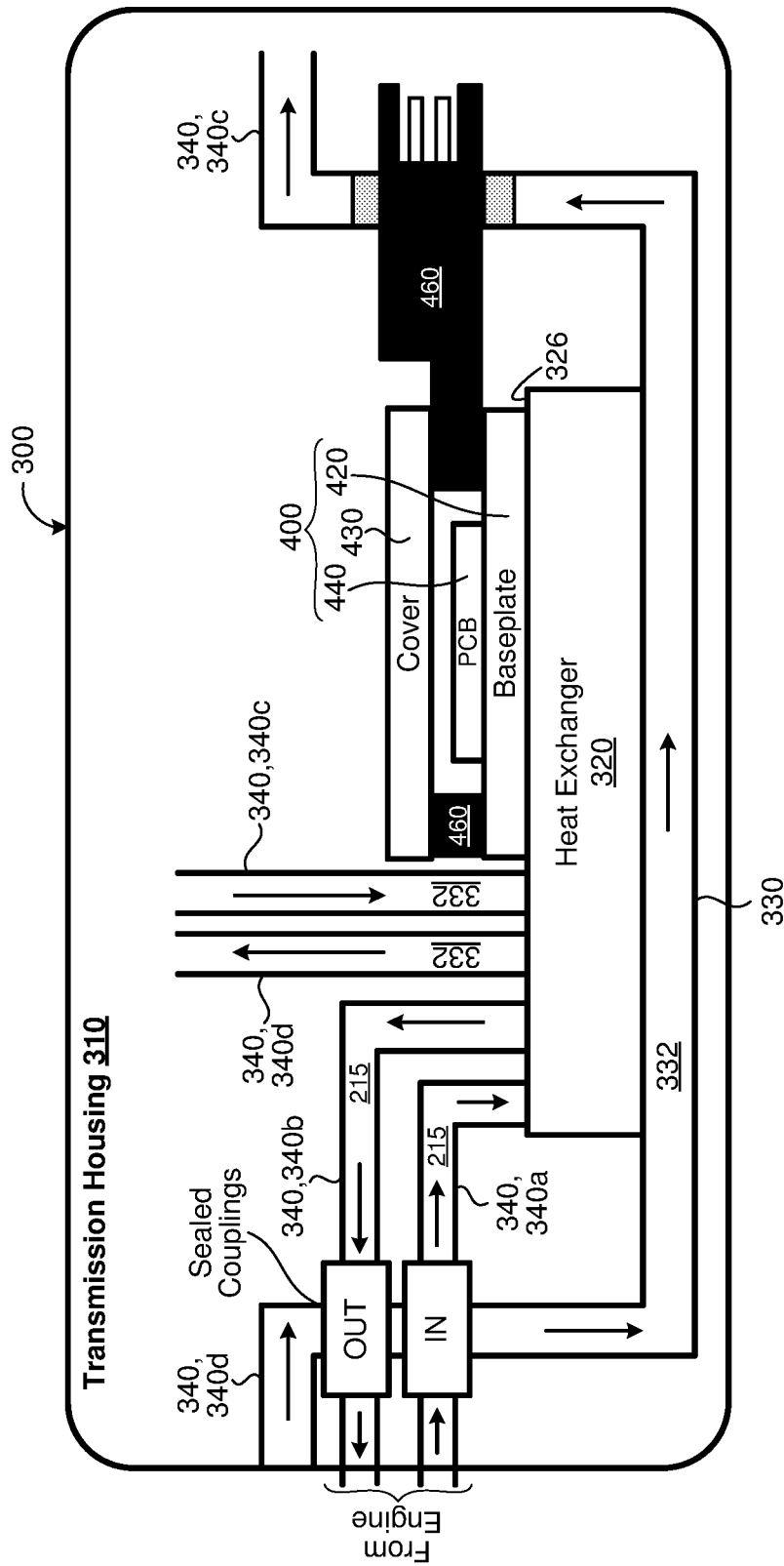
FIG. 3 is a schematic view of a portion of a transmission having a heat exchanger and a transmission control unit located inside the transmission.

Referring to both FIGS. 2 and 3, in some implementations, the transmission 300 includes a transmission pan 330. The pan 330 holds transmission fluid 332 that is circulated within the transmission housing 310. In addition, the pan 330 helps with cooling the transmission fluid 332 before circulating within the transmission 300 since the pan 330 holds more transmission fluid 332. In some examples, the pan 330 holds about half of the total amount of transmission fluid 332 contained within the transmission 300. Located on the bottom surface of the pan 330 is the heat exchanger 320. Also disposed within the pan 330 are two fluid conduits 340, 340a, 340b, a first fluid conduit 340a and a second fluid conduit 340b, both conduits 340, 340a, 340b are in fluid communication with each other, and are partially disposed inside the heat exchanger 320, but are not in fluid communication with the heat exchanger 320. Engine cooling fluid 213 from the engine 214 flows into the heat exchanger 320, after going through the heater core 216 when from the first shutoff valve 222 is an open position, through the first fluid conduit 340a and out of the heat exchanger 320 through the second fluid conduit 340, 340b and back to the engine 214.

There is also a third fluid conduit 340, 340c and a fourth fluid conduit 340, 340d that are in fluid communication with each other, and partially disposed in the heat exchanger 320, but are not in fluid communication with the heat exchanger 320. The portions of the conduits 340, 340a-d located within the heat exchanger 320 are configured such that when the engine 214 is warmed up, as the coolant is circulated through the first and second conduit 340a, 340b, the temperature of the transmission fluid 332 flowing through the third and fourth conduits 340c, 340d is increased to a desired temperature.

The TCU 400 is connected to and supported by the heat exchanger 320. The TCU 400 includes a base plate 420, a cover 430, and a printed circuit board (PCB) 440 disposed between the base plate 420 and the cover 430. The TCU 400 also includes a lead frame 460 that extends through a portion of the pan 330. The base plate 420 of the TCU 400 is connected to an outer surface 326 of the heat exchanger 320.

During operation, upon start up, the engine 214 is at ambient temperature, and therefore the coolant fluid 213 and transmission fluid 332 are also at ambient temperature. It is desirable to bring the transmission fluid 332 up to the optimal operating temperature as soon as possible. Therefore, heat from the engine 140 is used to increase the temperature of the transmission fluid 332 flowing through the transmission 300. During this time, in some examples, the coolant fluid 213 flowing from the engine 140 is split between the radiator 12 and the heater core 16. The coolant 213 flowing from the heater core 216 then flows to the transmission 300, more specifically the heat exchanger 320 within the transmission housing 310. At this time, the first bypass valve 222 is configured to direct the engine fluid 213 to the transmission 300. As the temperature of the engine 214 increases during warm up, the temperature of the engine coolant 213 also increases, and the engine coolant 213 flowing through the heat exchanger 320 increases the temperature of the transmission fluid 332.

After the engine 214 reaches the desired operating temperature, the thermostat 230 is reconfigured to receive coolant 213 from the radiator 212 that has been cooled. The coolant 213 is then at the desired operating temperature, and directed to the heat exchanger 320. This controls the temperature of the heat exchanger 320, and also controls the temperature of the transmission fluid 332 in the pan 330. Because the temperature of the heat exchanger 320 is controlled, the temperature of the surface 326 of the heat exchanger 320 that the TCU 400 is connected to is also controlled. Also, the temperature of the outer surface 326 is known, and the temperature of the transmission fluid 332 in the transmission pan 330 is also known, therefore, the TCU 400 may be placed inside the transmission housing 310 without the risk of the TCU 400 malfunctioning due to overheating.

Figure 1:
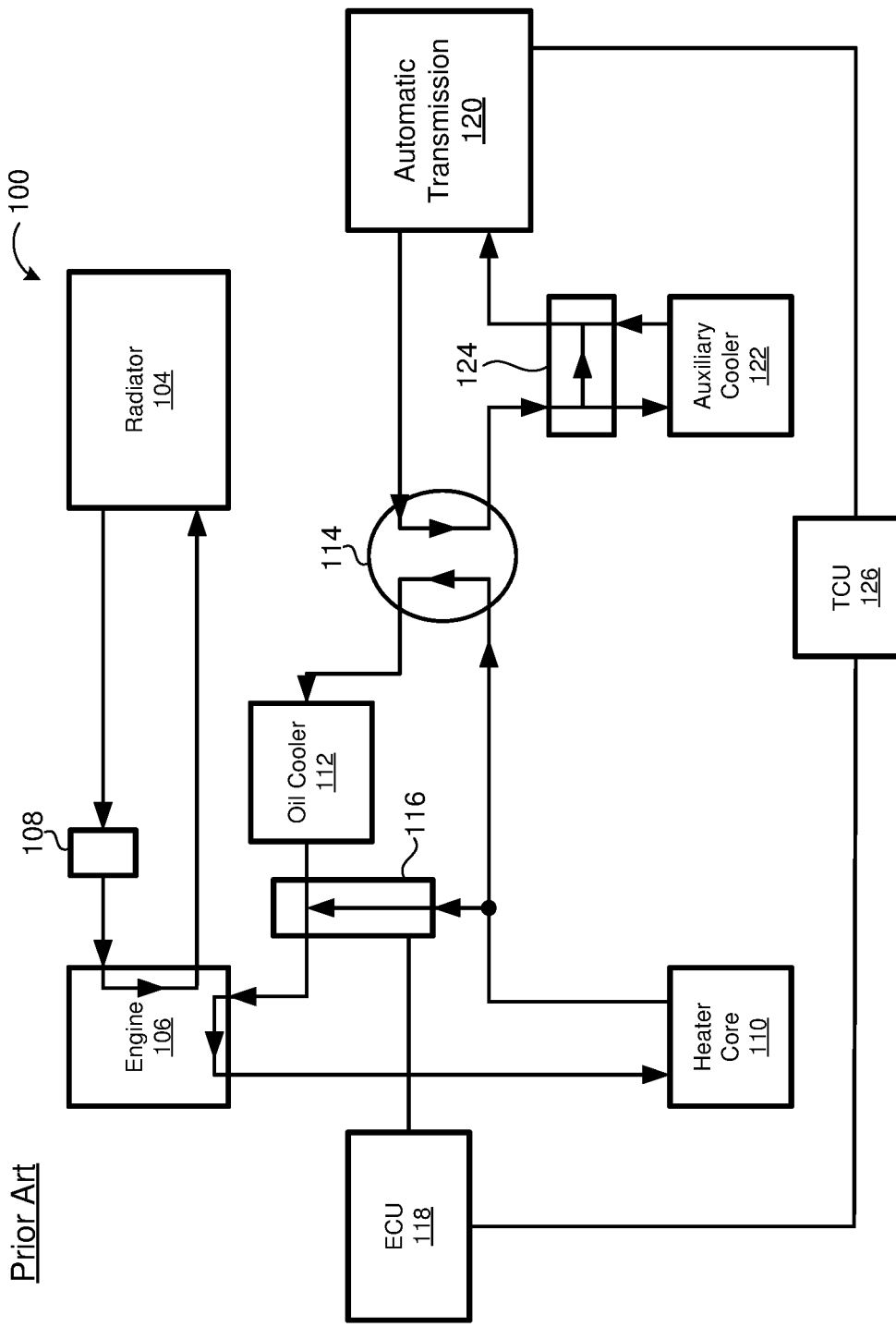
FIG. 1 is a schematic view of a prior art thermal management system where a heat exchanger is positioned outside of an automatic transmission.

The second bypass valve 224 may be located inside the transmission housing 310. Since the heat exchanger 320 is also located inside the transmission housing 310, one of the advantages of the system 210 is that the transmission fluid 332 does not need to be circulated outside the transmission housing 310 to an external heat exchanger (as shown in FIG. 1). This reduces the chance for the transmission fluid 332 to leak. Another advantage of the system 210 is that the heat exchanger 320 operates at a cooler temperature compared to a temperature of the transmission fluid 332 located away from the heat exchanger 320. As such, the transmission fluid 332 located around the heat exchanger 320 is cooler than the temperature of the transmission fluid 332 located further away from the heat exchanger 320. Also, the surface 326 of the heat exchanger 320 that supports the TCU 400 is cooler than remaining portions of the transmission 300, which helps keep the TCU 400 at a cooler temperature as well.

Another advantage of the system 210 is that since the transmission fluid 332 near the TCU 400 is cooler, the TCU 400 may be made of less robust materials, which reduces the cost of the system 210. Or in other examples, the TCU 400 may be made of more robust materials that are resistant to higher temperatures, and used in a transmission with a higher operating temperature because the transmission fluid around the TCU 400 is cooled.

A number of implementations have been described. Nevertheless, it will be understood that various modifications may be made without departing from the spirit and scope of the disclosure. Accordingly, other implementations are within the scope of the following claims.

What is claimed is:

1. A thermal management system comprising:
   a transmission having a transmission housing;
   a transmission pan positioned within the transmission housing;
   a heat exchanger disposed within the transmission housing, the transmission pan supporting the heat exchanger;
   an engine fluid conduit partially disposed within the heat exchanger, wherein engine coolant from an engine flows through the engine fluid conduit;
   a transmission fluid conduit partially disposed within the heat exchanger, wherein transmission fluid flows through the transmission fluid conduit; and
   a transmission control unit disposed on and supported by the heat exchanger, the transmission control unit further comprising:
   a base plate mounted on the heat exchanger;
   a cover;
   a circuit board disposed between the base plate and the cover;
   a lead frame, a portion of the lead frame being disposed between the base plate and the cover, and another portion of the lead frame extending through the transmission pan;
   wherein during start-up of the engine, the engine coolant flowing through the engine fluid conduit causes a temperature of the transmission fluid within the transmission fluid conduit to increase,
   wherein after the engine reaches an operating temperature, the engine coolant flowing through the engine fluid conduit at the operating temperature controls the temperature of the transmission fluid in the transmission pan.

2. The thermal management system of claim 1, wherein the heat exchanger controls the temperature of the transmission fluid located around the heat exchanger.

3. The thermal management system of claim 2, further comprising the transmission fluid circulating inside the transmission.

4. The thermal management system of claim 1, further comprising:
   an auxiliary cooler; and
   a bypass valve in fluid communication with a transmission conduit and the auxiliary cooler;
   wherein the bypass valve is located inside the transmission, the bypass valve configured to determine when the transmission fluid needs more cooling and therefore routes the transmission fluid to the auxiliary cooler.

5. A thermal management system comprising:
   a transmission including:
   a transmission housing;
   a transmission pan housed within the transmission housing;
   transmission fluid supported by the transmission pan; and
   a transmission fluid conduit configured to circulate the transmission fluid within the transmission housing;
   an engine fluid conduit configured to circulate engine coolant from an engine;
   a heat exchanger disposed within the transmission housing, the heat exchanger having a first surface positioned on the transmission pan and a second surface, the transmission fluid conduit and the engine fluid conduit partially disposed within the heat exchanger; and
   a transmission control unit disposed on and supported by the second surface of the heat exchanger such that the heat exchanger controls a temperature of the transmission control unit, the transmission control unit further comprising:
   a base plate mounted on the heat exchanger;
   a cover;
   a circuit board disposed between the base plate and the cover;
   a lead frame, a portion of the lead frame being disposed between the base plate and the cover, and another portion of the lead frame extending through the transmission pan;
   wherein during start-up of the engine, the engine coolant flowing through the engine fluid conduit causes a temperature of the transmission fluid within the transmission fluid conduit to increase,
   wherein after the engine reaches an operating temperature, the engine coolant flowing through the engine fluid conduit at the operating temperature controls the temperature of the transmission fluid in the transmission pan.

6. The thermal management system of claim 5, wherein the transmission fluid conduit comprises a first fluid conduit and a second fluid conduit, the first fluid conduit and the second fluid conduit are in fluid communication with each other, and partially disposed within the heat exchanger.

7. The thermal management system of claim 5, wherein the engine fluid conduit has a first fluid conduit and a second fluid conduit, the first fluid conduit and the second fluid conduit are in fluid communication with each other, and partially disposed within the heat exchanger.

8. The thermal management system of claim 7, wherein the engine fluid conduit and the transmission fluid conduit exchange heat altering a temperature associated with each one of the engine fluid conduit and the transmission fluid conduit.

9. The thermal management system of claim 5, wherein the transmission control unit is submerged in the transmission fluid located in the transmission pan.

10. The thermal management system of claim 5, wherein the second surface of the heat exchanger has a controlled temperature.

* * * * *